(12) United States Patent
Okushima

(10) Patent No.: US 8,072,720 B2
(45) Date of Patent: Dec. 6, 2011

(54) ELECTROSTATIC PROTECTION CIRCUIT

(75) Inventor: Mototsugu Okushima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 641 days.

(21) Appl. No.: 12/078,977

(22) Filed: Apr. 9, 2008

(65) Prior Publication Data

US 2008/0253044 A1    Oct. 16, 2008

(30) Foreign Application Priority Data

Apr. 12, 2007   (JP) ................. 2007-104829

(51) Int. Cl.
    *H02H 9/00*    (2006.01)
(52) U.S. Cl. ........................................ 361/56
(58) Field of Classification Search .............. 361/56
    See application file for complete search history.

(56) References Cited

U.S. PATENT DOCUMENTS

| | | | | |
|---|---|---|---|---|
| 5,610,425 A | * | 3/1997 | Quigley et al. | 257/358 |
| 5,901,022 A | * | 5/1999 | Ker | 361/56 |
| 6,617,649 B2 | * | 9/2003 | Chang et al. | 257/355 |
| 2004/0141270 A1 | * | 7/2004 | Kaneki | 361/56 |
| 2005/0231866 A1 | | 10/2005 | Mergens et al. | |

OTHER PUBLICATIONS

Ajith Amerasekera, "ESD in Silicon Integrated Circuits", Second Edition, Wiley, 2002, p. 117-118.
Momodomi, et al., "A Circular Output Protection Device Using Bipolar Action", IEEE Reliability Physics Symposium 1987, p. 169-173.

* cited by examiner

*Primary Examiner* — Rexford Barnie
*Assistant Examiner* — Angela Brooks
(74) *Attorney, Agent, or Firm* — McGinn Intellectual Property Law Group, PLLC

(57) ABSTRACT

An electrostatic protection circuit that affords protection without effecting transfer of an ordinary output signal includes an output terminal; a ground terminal; a first N-channel transistor having its drain and source connected between the output terminal and the ground terminal GND; a first electrostatic protection element connecting the output terminal and the ground terminal; and a second electrostatic protection element connected the drain and gate of the first N-channel transistor. The second N-channel transistor is connected to the gate of the first N-channel transistor. The gate potential of the first N-channel transistor rises and the gate-to-drain voltage of the first N-channel transistor is limited to a value below a prescribed value by a current that flows into the second electrostatic protection element owing to application of static electricity to the output terminal, and resistance of the second N-channel transistor, which is the ON state, as seen from the gate of the first N-channel transistor.

15 Claims, 16 Drawing Sheets

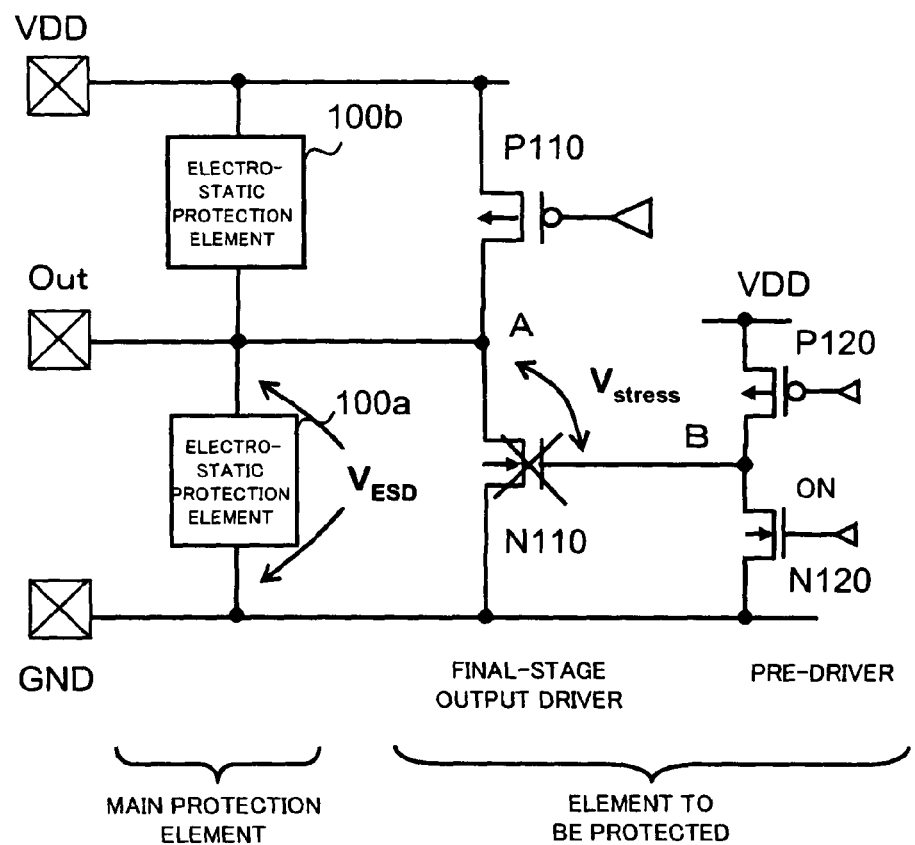
FIG. 16  REFERENCE CASE

ELECTROSTATIC PROTECTION CIRCUIT

FIELD OF THE INVENTION

Reference to Related Application

The present application is claiming the priority of the earlier Japanese patent application No. 2007-104829 filed on Apr. 12, 2007, the entire disclosure thereof being incorporated herein by reference thereto.

This invention relates to an electrostatic protection circuit. More particularly, the invention relates to a circuit for protecting against electrostatic discharge (ESD) from an external terminal.

BACKGROUND OF THE INVENTION

A semiconductor integrated circuit device (IC) composed of MOS transistors, etc., requires ESD resistance with respect to surge voltage and surge current impressed upon an external terminal (input/output pad) of the semiconductor integrated circuit device owing to electrostatic discharge. In general, therefore, an electrostatic protection circuit is connected to the external terminal. One such electrostatic protection circuit uses a protection terminal that relies upon a grounded-gate NMOS transistor.

With the progress that has been made in producing more miniscule semiconductor integrated circuit devices in recent years, resistance of the internal transistors to electrostatic discharge is of greater importance. Some examples of such an electrostatic protection circuit are disclosed in Non-Patent Documents 1-2 and Patent Document 1, respectively.

[Non-Patent Document 1] AJITH AMERASEKERA, "ESD in Silicon Integrated Circuits", Second Edition, WILEY, 2002, p. 117-118

[Non-Patent Document 2] IEEE Reliability Physics Symposium 1987, Page 169 to 173

[Patent Document 1] US2005/0231866A1

SUMMARY OF THE DISCLOSURE

The following analyses are given by the present invention. The entire disclosures of the above mentioned Non-Patent Documents and Patent Document are incorporated herein by reference thereto.

FIG. 13 (provided in the present invention for elucidating the technology) is a diagram illustrating change in breakdown voltage ($V_{BD}$) of a gate oxide film and in clamp voltage ($V_{clamp}$) of a protection element that accompany miniaturization of a transistor. As the transistor becomes more miniscule in FIG. 13, the gate oxide film becomes thinner and $V_{BD}$ decreases sharply substantially in proportion to the thickness of the gate oxide film. By contrast, $V_{clamp}$ in a gate-grounded NMOS-type protection element exhibits almost no decline and a design window ($V_{BD}-V_{clamp}$) representing ESD resistance is small.

A known technique for the purpose of enlarging the design window is to further provide an element that is to be protected with an auxiliary protection circuit (a second protection element). Voltage produced at occurrence of electrostatic discharge of the main protection element (first protection element) is mitigated by the second protection element without being applied upon the element to be protected. That is, the design window can be enlarged. The first protection element has the ability to pass a large current ascribable to electrostatic discharge. With respect to voltage produced by the first protection element in a case where a large current is discharged through it, the second protection element mitigates voltage produced at the location that is most critical for the element to be protected.

Referring to FIG. 14, a comparative example of such circuitry is illustrated by the present invention for comparative purpose. As shown in FIG. 14, an electrostatic protection element 100a is provided between an input terminal In and a ground terminal GND, and an electrostatic protection element 100b is provided between the input terminal In and a power source terminal VDD. Further, a resistance element R101 is provided between the input terminal In and the gates of an N-channel transistor N101 and P-channel transistor P101. Provided between these two gates and the ground terminal GND is a protection element 101, e.g., an N-channel transistor N102 having a drain connected to these two gates as well as a gate and source connected to the ground terminal GND. The N-channel transistor N101 and P-channel transistor P101 construct an input-stage driver (inverter circuit) and transfer a signal, which is supplied to the input terminal In, to the internal circuitry.

In the electrostatic protection circuit described above, the electrostatic protection elements 100a, 100b function as a first protection element (main protection element), and the resistance element R101 and protection element 101 function as a second protection element. The input-stage driver corresponds to the element to be protected. That is, in a case where a voltage $V_{ESD}$ ascribable to electrostatic discharge is applied upon the input terminal In, a discharge current Id that cannot be absorbed by the electrostatic protection element 100a flows into the ground terminal GND via the resistance element R101 and protection element 101 (N-channel transistor N102, which has broken down). At this time, voltage $V_{stress}$ across the source and gate of the N-channel transistor N101 is limited by the breakdown voltage of the N-channel transistor N102, and the N-channel transistor N101 is prevented from being damaged by the electrostatic discharge.

Another example of an electrostatic protection circuit is described in Patent Document 1. FIG. 15 is illustrated as a comparative example of such circuit according to the teaching of Patent Document 1. As shown in FIG. 15, an electrostatic protection element 206 is provided between an input terminal IN and a ground terminal VSS, and an electrostatic protection element 208 is provided between the input terminal IN and power source terminal VDD. Further, an electrostatic protection element 226 is provided between the input terminal IN, namely the gates of an N-channel transistor 204 and P-channel transistor 202, and the source of the N-channel transistor 204, and an electrostatic protection element 228 is provided between the input terminal IN and the source of the P-channel transistor 202. Furthermore, an impedance circuit 224 is provided between the source of the N-channel transistor 204 and the ground terminal VSS, and an impedance circuit 222 is provided between the source of the P-channel transistor 202 and the power source terminal VDD. The N-channel transistor 204 and P-channel transistor 202 construct an input-stage driver (inverter circuit) and transfer a signal, which is input to the input terminal IN, to an output terminal OUTPUT.

In the electrostatic protection circuit constructed as set forth above, the electrostatic protection elements 206, 208 function as a first protection element (main protection element), and the electrostatic protection element 226, impedance circuit 224, electrostatic protection element 228 and impedance circuit 222 function as a second protection element. The input-driver stage corresponds to the element to be protected. That is, if a voltage $V_{esd}$ ascribable to electrostatic discharge is applied upon the input terminal IN, discharge current that cannot be absorbed by the electrostatic protection element 206 flows into the ground terminal VSS via the electrostatic protection element 226 and impedance circuit 224. At this time, voltage across the source and gate of the N-channel transistor 204 is limited by breakdown voltage $V_{asp}$ of the electrostatic protection element 226, and the N-channel transistor 204 is prevented from being damaged by the electrostatic discharge. It should be noted that since the P-channel transistor 202 functions similarly to protect against static electricity, this need not be described here.

In accordance with the conventional electrostatic protection circuits, if voltage ascribable to electrostatic discharge is applied upon the input terminal, discharge current that cannot be absorbed by first protection element flows to ground (or into the power source) via the second protection element and impedance circuit (which, by way of example, corresponds to the resistance element R101 in Non-Patent Document 1 and to the impedance circuit 224 in Patent Document 1). Accordingly, the voltage across the source and gate of the N-channel transistor (P-channel transistor) of the input-stage driver is limited and the N-channel transistor (P-channel transistor) can be prevented from being damaged. In such an electrostatic protection circuit, the second protection element maintains a high impedance with respect to an ordinary signal that enters from the input terminal and therefore the input signal is not affected.

However, there is the danger that the above-mentioned impedance circuit will have an adverse effect upon an ordinary signal that enters from the input terminal. For example, in FIG. 14, a low-pass filter is formed by the resistance element R101 and parasitic capacitance at the gates of the N-channel transistor N101 and P-channel transistor P101, thereby blocking (cutting off) the high-frequency components of the signal. Further, in FIG. 15, the dynamic range of the output signal is narrowed by the impedance circuit 224 (or 222). Furthermore, a low-pass filter is formed by the impedance circuit 224 (or 222) and parasitic capacitance at the drain of the N-channel transistor 204 or P-channel transistor 202) and hence there is the possibility that the high-frequency components of the output signal will be cut off.

It should be noted that the conventional electrostatic protection circuits described above are for application to an input circuit. However, the fact that an output circuit also requires to be prevented from being damaged by electrostatic discharge likewise the case with the input circuit will be described below.

FIG. 16 is a diagram illustrating a comparative example of a reference case where static electricity acts upon an output circuit. In FIG. 16, the electrostatic protection element 100a corresponding to a first protection element is inserted between an output terminal Out, and the electrostatic protection element 100b corresponding to the first protection element is inserted between the output terminal Out and the power source terminal VDD. Further, the gate of an N-channel transistor N110 is connected to the output (node B) in a pre-driver of a CMOS circuit comprising an N-channel transistor N120 and a P-channel transistor P120. The source of the N-channel transistor N110 is connected to the ground terminal GND. Further, the drain of the N-channel transistor N110 and the drain of a P-channel transistor P110 are connected together and further to the output terminal Out. It should be noted that the source of the P-channel transistor P110 is connected to the power source terminal VDD and the gate thereof is connected to an internal circuit, not shown. The N-channel transistor N110 and P-channel transistor P110 construct a final-stage output driver.

In the output circuit constructed as set forth above, voltage $V_{ESD}$ is produced across the electrostatic protection element 100a if static electricity is impressed upon the output terminal Out. If the design window shown in FIG. 13 is small, the voltage $V_{ESD}$ exceeds the breakdown voltage of the N-channel transistor N110, which is the circuit to be protected, and the N-channel transistor N110 sustains damage. That is, in a case where the circuit to be protected shown in FIG. 16 is an output circuit, assume that the N-channel transistor N120 constituting the pre-driver will be fixed to the ON state when static electricity is applied. At such time the N-channel transistor N120 conducts, the gate potential of the N-channel transistor N110 becomes the potential at the ground terminal GND, the voltage $V_{ESD}$ is impressed across the drain and gate of the N-channel transistor N110 and there is the danger that the N-channel transistor N110 will be destroyed.

It should be noted that in a case where the N-channel transistor N120 is in the OFF state, the gate potential of the N-channel transistor N110 becomes an intermediate potential, the voltage $V_{ESD}$ is not impressed across A and B as is and the N-channel transistor N110 is not readily destroyed. However, it is difficult to predict how the state of the N-channel transistor N120 will be fixed when static electricity is applied. An arrangement so adapted that the N-channel transistor N110 will not be destroyed regardless of the state of the N-channel transistor is desired.

According to a first aspect of the present invention, there is provided an electrostatic protection circuit comprising: a first terminal; a second terminal, a first MOS transistor having a drain and a source coupled to the first and second terminals, respectively. A first electrostatic protection element connects the first and second terminals. A second electrostatic protection element connects a gate of the first MOS transistor and either of said first terminal and the drain of said first MOS transistor.

According to a second aspect of the present invention, there is provided an electrostatic protection circuit comprising: a first terminal; a second terminal; and a first MOS transistor having a drain and a source connected between the first and second terminals. A first electrostatic protection element connects the first and second terminals. A second electrostatic protection element connects a gate of the first MOS transistor to one of the first and second terminals. The one of the first and second terminals is directly or indirectly connected to the drain of the first MOS transistor.

According to a third aspect of the present invention, there is provided an electrostatic protection circuit comprising: a first terminal; a second terminal; and a first MOS transistor having a drain and a source connected between the first and second terminals. A first element connects the first and second terminals. A second element connects a gate of the first MOS transistor to one of the first and second terminals. The one of the first and second terminals is directly or indirectly connected to the drain of the first MOS transistor. The first and second elements have impedances that fall when a voltage exceeding a prescribed voltage is applied.

According to a fourth aspect of the present invention, there is provided a semiconductor device having the electrostatic protection circuit set forth in any of the foregoing aspects.

In accordance with the present invention, voltage produced across the drain and gate of a first MOS transistor with application of static electricity is held below a prescribed value to thereby prevent the first MOS transistor from being damaged by electrostatic discharge. In this case, an electrostatic protection element maintains a high impedance with respect to an ordinary output signal. As a result, protection against static electricity can be achieved without transfer of an ordinary output signal being affected.

Other aspects/features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

FIG. 16 is a circuit diagram illustrating a comparative example of an output circuit to which static electricity is applied.

PREFERRED MODES OF THE INVENTION

Figure 1:
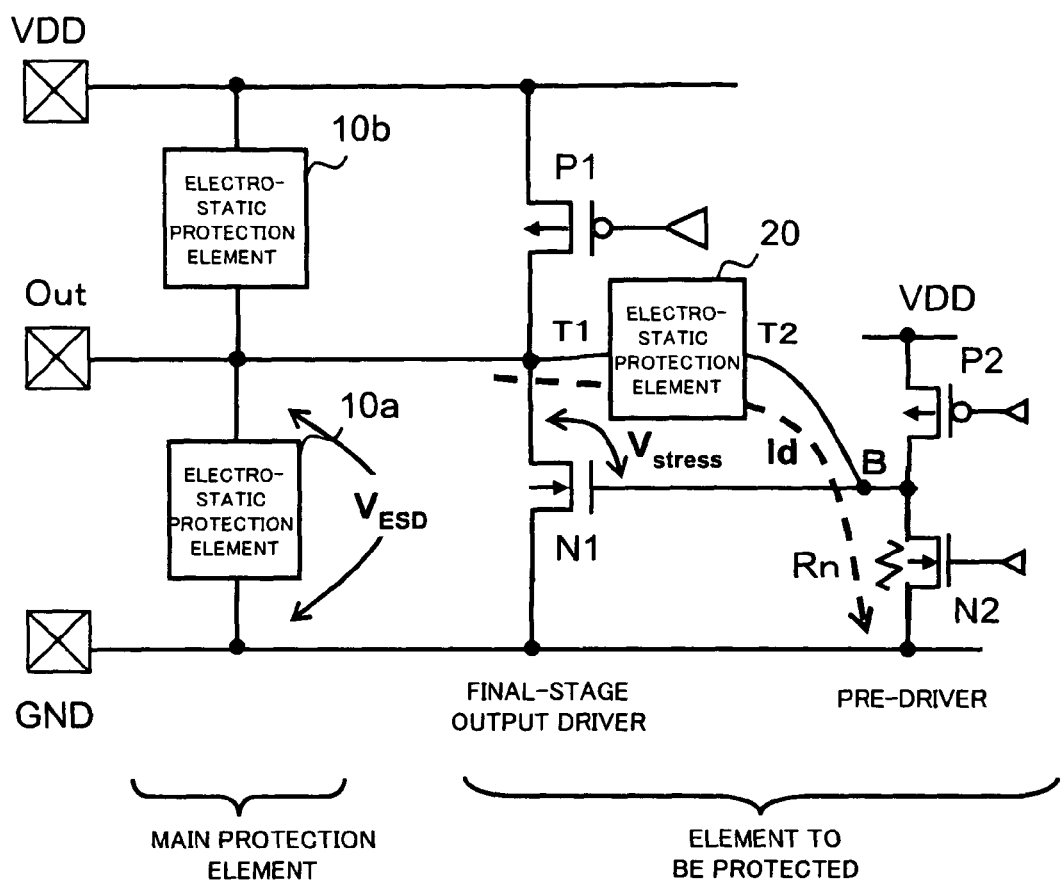
FIG. 1 is a block diagram illustrating the configuration of an electrostatic protection circuit according to a first exemplary embodiment of the present invention.

Preferred modes may be implemented as follows according various aspects.

Preferably, an internal circuit is connected to the gate of the first MOS transistor; and gate-to-drain voltage of the first MOS transistor is limited to a value below a prescribed value by a current that flows into the second electrostatic protection element owing to application of static electricity to the first terminal, and a resistance of the internal circuit as seen from the gate of the first MOS transistor.

The internal circuit may include a second MOS transistor of the same conductivity type as that of the first MOS transistor, the second MOS transistor having a drain connected to the gate of the first MOS transistor and a source connected to a ground terminal; and the resistance of the internal circuit may include a drain-to-source resistance component of the second MOS transistor.

The first terminal may be an output terminal, the second terminal may be a power source terminal or ground terminal, and the electrostatic protection circuit further may comprise an output driver circuit having the output terminal as its output; the first MOS transistor may be included in the output driver circuit.

The output driver circuit may include a differential amplifier circuit for output purposes; and the first MOS transistor may be one transistor of a differential pair in the differential amplifier circuit.

The output driver circuit may include a differential amplifier circuit for output purposes; and the first MOS transistor may be a current-source transistor connected to sources of a transistor pair in the differential amplifier circuit.

The one of the first and second terminals may be indirectly connected to the drain of the first MOS transistor via an impedance or coupler element.

The impedance or coupler element may comprise a capacitor.

The one of the first and second terminals may be indirectly connected to the drain of the first MOS transistor via a transistor constituting a differential pair.

The first MOS transistor may constitute one of a differential pair transistors.

An electrostatic protection circuit in a preferred mode of practicing the present invention comprises: a first terminal (Out, FIG. 1); a second terminal (GND, FIG. 1); a first MOS transistor (N1, FIG. 1) having a drain and a source connected between the first and second terminals; a first electrostatic protection element (10a, FIG. 1) connecting the first and second terminals; and a second electrostatic protection element (20, FIG. 1) connecting the drain and a gate of the first MOS transistor. (Note, the reference signs in the parentheses annexed to each element refer to an example for helping the better understanding.)

In regard to the provision of the first MOS transistor whose drain and source are connected between the first and second terminals, a circuit that exhibits a low impedance to transfer of an ordinary output signal and to outflow of discharge current that accompanies application of static electricity, e.g., a capacitance element or a MOS transistor that is in the ON state, etc., is allowed to be inserted in the connection path. Further, in regard to the connecting of the drain and gate of the first MOS transistor by the second electrostatic protection element, that the connection be made via a circuit that exhibits a low impedance to transfer of an ordinary output signal and to outflow of discharge current that accompanies application of static electricity, e.g., a capacitance element or a MOS transistor that is in the ON state, etc., is allowed.

Accordingly, it is preferred to so arrange it that the internal circuit is connected to the gate of the first MOS transistor and that the gate-to-drain voltage of the first MOS transistor be limited to a value below a prescribed value by the current that flows into the second electrostatic protection element owing to application of static electricity to the output terminal, and a resistance (Rn, FIG. 1) of the internal circuit as seen from the gate of the first MOS transistor.

The internal circuit includes a second MOS transistor (N2, FIG. 1) of the same conductivity type as that of the first MOS transistor. The second MOS transistor has a drain connected to the gate of the first MOS transistor and a source connected to the ground terminal. It is preferred that the resistance of the internal circuit includes the drain-to-source resistance component of the second MOS transistor.

The circuit may be an output driver circuit the output of which is the output terminal, and the first MOS transistor may be included in the output driver circuit.

Figure 11:
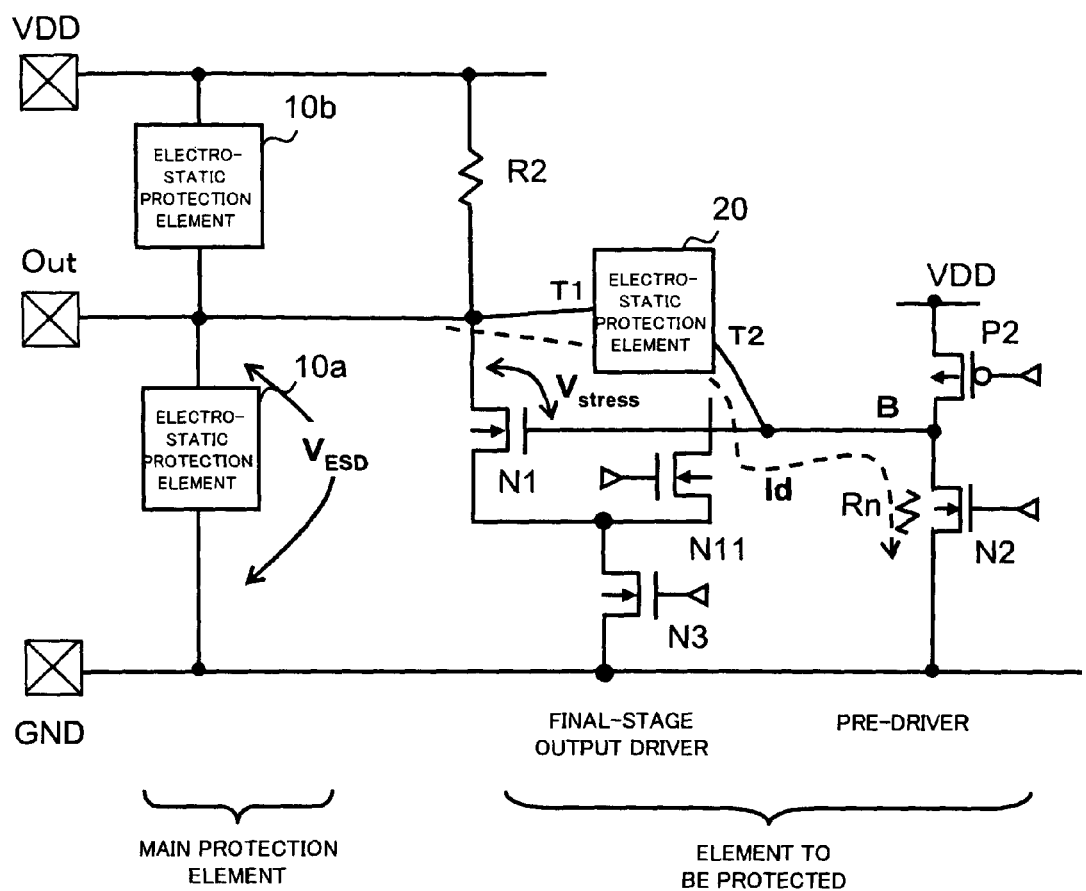
FIG. 11 is a block diagram illustrating the configuration of an electrostatic protection circuit according to a ninth exemplary embodiment of the present invention.

The output driver circuit may include a differential amplifier circuit for output, and the first MOS transistor may be one transistor (N1, FIG. 11) of a differential pair (N1, N11; FIG. 11) in the differential amplifier circuit.

The output driver circuit may include a differential amplifier circuit for output, and the first MOS transistor may be a current-source transistor (N3a, FIG. 12) connected to the sources of the differential pair in the differential amplifier circuit.

In accordance with the electrostatic protection circuit thus constructed, current that flows into the second electrostatic protection element owing to application of static electricity to the first terminal flows through the resistance of the internal circuit as seen from the gate of the first MOS transistor. Accordingly, the gate-to-drain voltage of the first MOS transistor attendant upon application of static electricity is held below a desired value and the first MOS transistor can be prevented from being damaged by electrostatic discharge. The electrostatic protection element maintains a high impedance with respect to an ordinary output signal and has no effect upon the output of the output signal. Preferred exemplary embodiments of the invention will now be described in detail with reference to the drawings.

First Exemplary Embodiment

FIG. 1 is a block diagram illustrating the configuration of an electrostatic protection circuit according to a first exemplary embodiment of the present invention. As shown in FIG. 1, the electrostatic protection circuit includes power source terminal VDD, output terminal Out, ground terminal GND, electrostatic protection elements 10a, 10b, 20, N-channel transistors N1, N2 and P-channel transistors P1, P2. The electrostatic protection element 10a is inserted between the output terminal Out and the ground terminal GND, and the electrostatic protection element 10b is inserted between the output terminal Out and the power source terminal VDD. The gate of the N-channel transistor N1 is connected to the output (node B) of a pre-driver of a CMOS circuit comprising the N-channel transistor N2 and P-channel transistor P2. The source of the N-channel transistor N1 is connected to the ground terminal GND. Further, the drain of the N-channel transistor N1 and the drain of the P-channel transistor P1 are tied together and connected to the output terminal Out. It should be noted that the source and drain of the P-channel transistor P1 are connected to the power source terminal VDD and to an internal circuit (not shown), respectively. The N-channel transistor N1 and the P-channel transistor P1 construct a final-stage output driver. Furthermore, the electrostatic protection element 20 is connected between the drain and gate of the N-channel transistor N1 (and thus between the output terminal Out and the gate of the N-channel transistor N1).

Figure 2A:
FIGS. 2A to 2D are diagrams illustrating examples of arrangements of an electrostatic protection element.
Figure 2B:
Figure 2C:
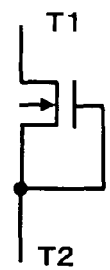
Figure 2D:
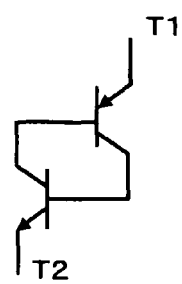

FIGS. 2A to 2D are diagrams illustrating examples of arrangements of the electrostatic protection element 20. The electrostatic protection element 20 is a circuit that maintains a high impedance when the voltage impressed across two terminals (T1 and T2) [(potential at terminal T1)−(potential at terminal T2)] is less than a prescribed voltage, and exhibits a low impedance when the applied voltage exceeds the prescribed voltage. For example, the circuit may be one in which a plurality of diodes (three in the illustrated example) are serially connected in the forward direction, as illustrated in FIG. 2A. Further, as illustrated in FIG. 2B, it may be so arranged that a diode is backward-connected and use is made of breakdown at the pn junction. Furthermore, as illustrated in FIG. 2C, the electrostatic protection element may be constituted by an N-channel transistor whose gate and source are connected together and that utilizes drain-source breakdown. (The same applies likewise to a P-channel transistor.) Further, as illustrated in FIG. 2D, the electrostatic protection element may be constituted by a thyristor obtained by combining a PNP transistor and an NPN transistor.

In the electrostatic protection circuit constructed as set forth above, the electrostatic protection elements 10a, 10b function as a first protection element (main protection element), and the electrostatic protection element 20 functions as a second protection element. The pre-driver and the final-stage output driver correspond to elements to be protected by the electrostatic protection elements 10a, 10b, 20. That is, in a case where voltage $V_{ESD}$ ascribable to electrostatic discharge is impressed upon the output terminal Out, discharge current Id that cannot be absorbed by the electrostatic protection element 10a flows into the ground terminal GND via the electrostatic protection element 20 and resistance Rn between the drain and source of the N-channel transistor N2, which is ON. At this time, discharge current Id flows into the resistance Rn, as a result of which the potential at the output (node B) in the pre-driver rises. Here the resistance Rn corresponds to the sum total of the channel resistance between the drain and source of the N-channel transistor N2, diffusion-layer resistance of the drain and source of this transistor, and resistance of an extension region underlying the side walls of the drain and source of this transistor. Owing to the resistance Rn, voltage $V_{stress}$ across the drain and gate of the N-channel transistor N1 is reduced in comparison with the voltage $V_{ESD}$, thereby making it possible to prevent the N-channel transistor N1 from being damaged by electrostatic discharge. It should be noted that in a case where the N-channel transistor N2 is OFF, the potential at the output (node B) of the pre-driver becomes a potential that is intermediate of the potential of the power source terminal VDD and the potential at the ground terminal GND, and the voltage $V_{ESD}$ is not directly impressed across the drain and gate of the N-channel transistor N1.

Further, since the electrostatic protection elements 10a, 10b, 20 exhibit a high impedance to an output signal of an ordinary level, they have no adverse effect upon the output of the output signal from the output terminal Out.

By providing a semiconductor device with the above-described electrostatic protection circuit, the device operates without an ordinary output signal being affected and is capable of fully withstanding electrostatic discharge.

Second Exemplary Embodiment

Figure 3:
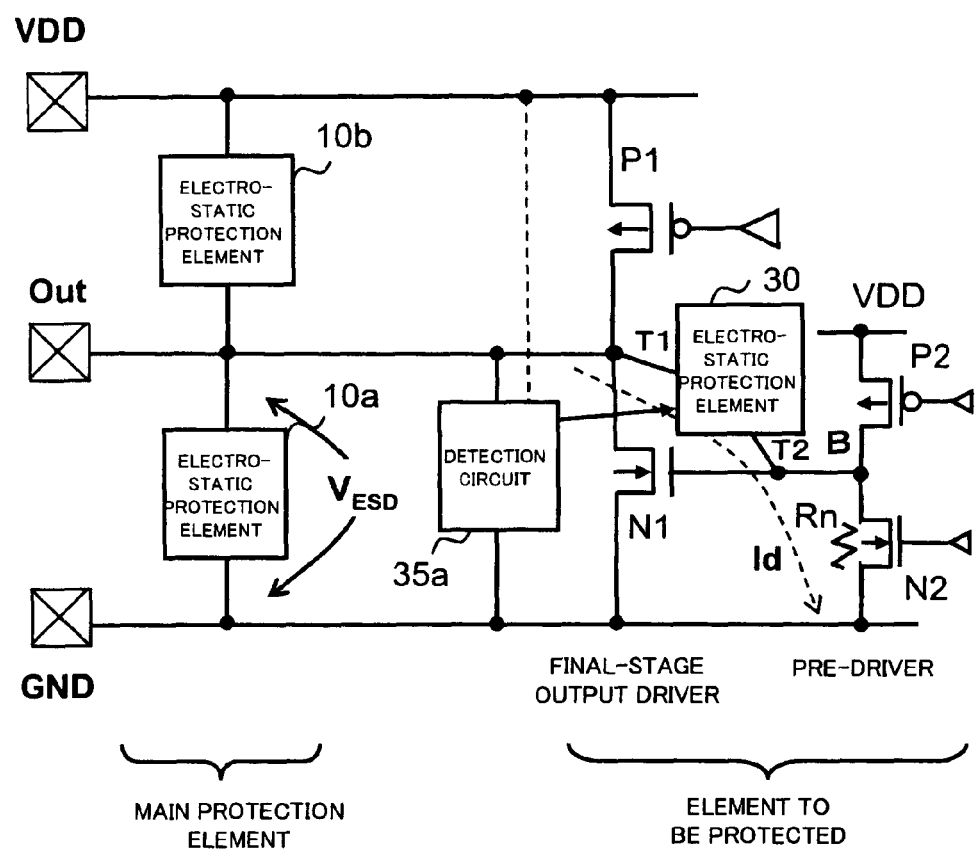
FIG. 3 is a block diagram illustrating the configuration of an electrostatic protection circuit according to a second exemplary embodiment of the present invention.

FIG. 3 is a block diagram illustrating the configuration of an electrostatic protection circuit according to a second exemplary embodiment of the present invention. Components in FIG. 3 identical with those shown in FIG. 1 are designated by like reference characters and need not be described again. The electrostatic protection circuit of FIG. 3 has an electrostatic protection element 30 functioning as the second protection element and a detection circuit 35a, these being provided in place of the electrostatic protection element 20 in FIG. 2. The detection circuit 35a is inserted between the output terminal Out and the ground terminal GND, detects the signal level at the output terminal Out and controls the electrostatic protection element 30 in such a manner that the electrostatic protection element 30 exhibits a low impedance if the detected signal level is equal to or greater than a prescribed signal level. It should be noted that an arrangement may be adopted in which the detection circuit 35a is inserted between the output terminal Out and the power source terminal VDD, as indicated by the dashed line, to detect the signal level at the output terminal Out.

Figure 4:
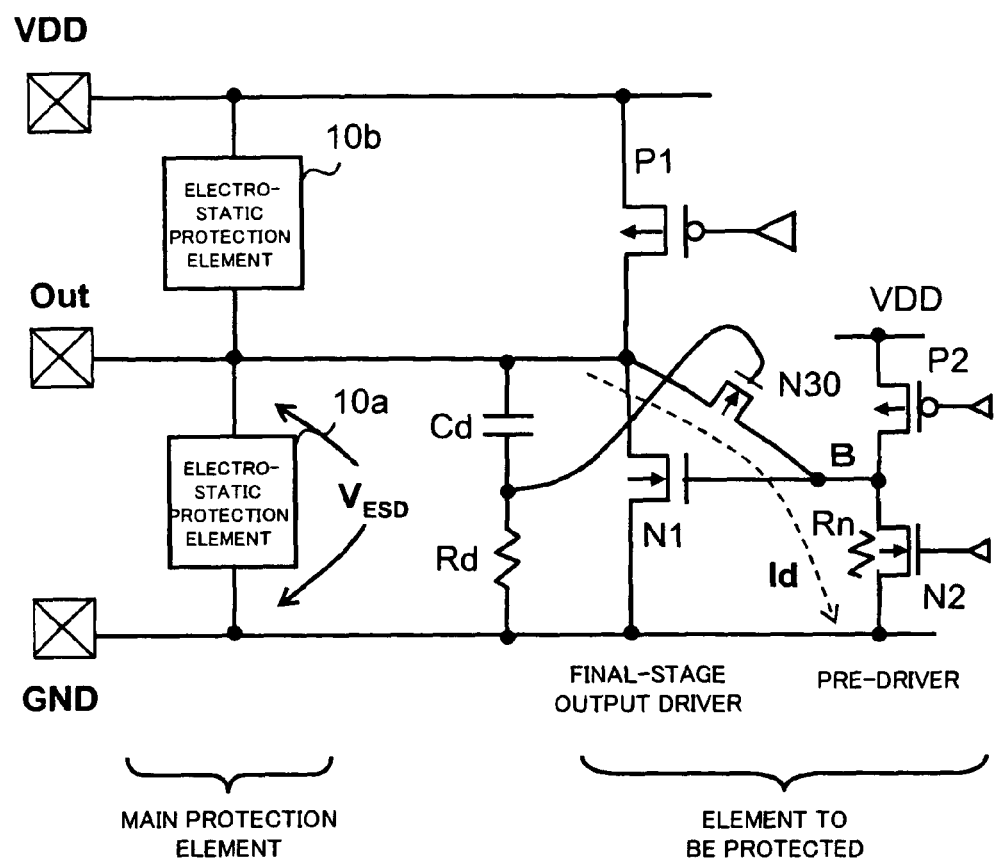
FIG. 4 is a block diagram illustrating the details of the electrostatic protection circuit according to the second exemplary embodiment.

FIG. 4 is a circuit diagram illustrating a specific example of the electrostatic protection element 30 and detection circuit 35a. The detection circuit 35a comprises resistance element Rd and a capacitance element Cd having a first end connected to the output terminal Out and a second end connected to the ground terminal GND via the resistance element Rd. Further, the electrostatic protection element 30 is constituted by an N-channel transistor N30 having a gate connected to the second end of the capacitance element Cd, a drain connected to the output terminal Out and a source connected to the output (node B) in the pre-driver. The capacitance value of the capacitance element Cd and the resistance value of the resistance element Rd are set is such a manner that there will be no effect upon an output signal at an ordinary level.

In the electrostatic protection circuit constructed as set forth above, the potential at the gate of the N-channel transistor N30 rises via the capacitance element Cd if the voltage $V_{ESD}$ ascribable to electrostatic discharge is impressed upon the output terminal Out. Accordingly, the N-channel transistor N30 turns on and discharges current Id, which cannot be absorbed by the electrostatic protection element 10a, flows into the ground terminal GND via the N-channel transistor N30 and the resistance Rn between the drain and source of the N-channel transistor N2, which is ON.

The gate voltage of the N-channel transistor N1 rises owing to the resistance Rn and the voltage $V_{ESD}$ is not impressed directly across the drain and gate of the N-channel transistor N1. As a result, damage to the N-channel transistor N1 due to electrostatic discharge is prevented.

As in the first exemplary embodiment, if the N-channel transistor N2 is OFF, the potential at the output (node B) of the pre-driver becomes a potential that is intermediate the potential of the power source terminal VDD and the potential at the ground terminal GND, and the voltage $V_{ESD}$ is not directly impressed across the drain and gate of the N-channel transistor N1. Further, since the electrostatic protection elements 10a, 10b, 30 exhibit a high impedance to an output signal of an ordinary level, they have no adverse effect upon the output of the output signal from the output terminal Out.

Third Exemplary Embodiment

Figure 5:
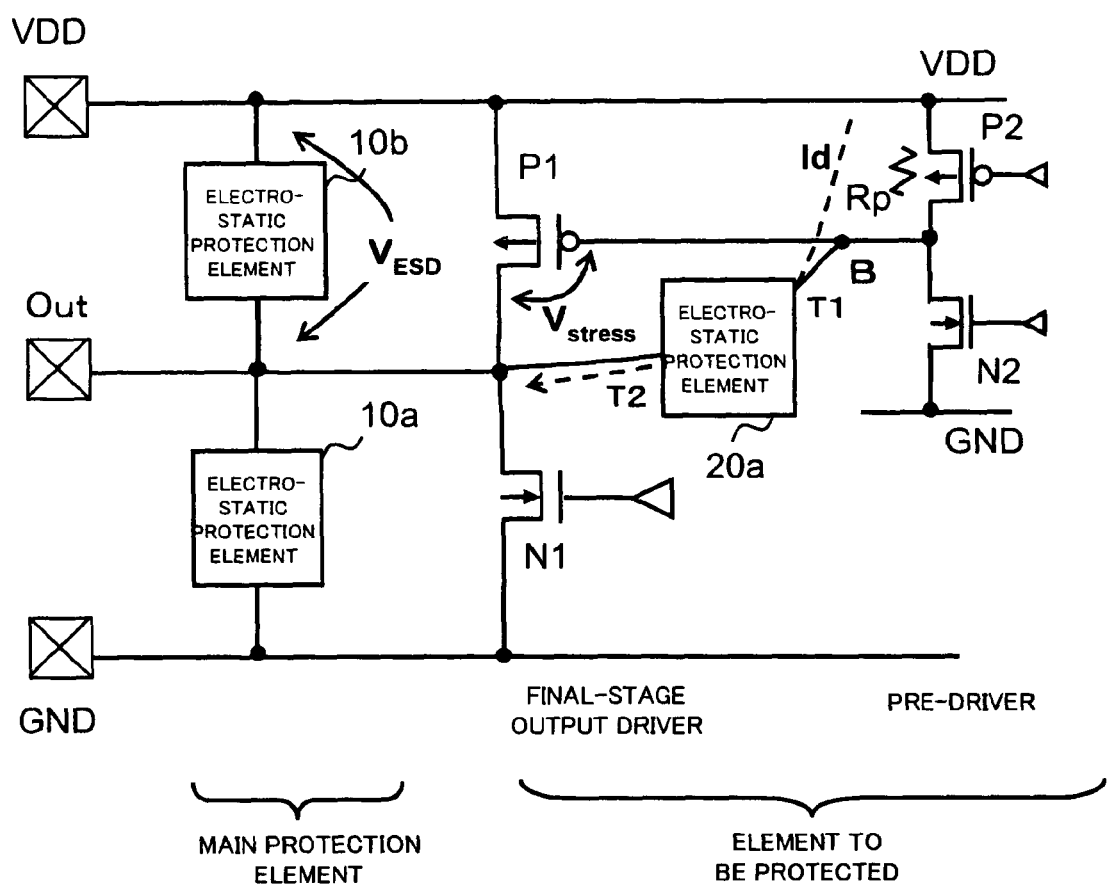
FIG. 5 is a block diagram illustrating the configuration of an electrostatic protection circuit according to a third exemplary embodiment of the present invention.

FIG. 5 is a block diagram illustrating the configuration of an electrostatic protection circuit according to a third exemplary embodiment of the present invention. Components in FIG. 5 identical with those shown in FIG. 1 are designated by like reference characters and need not be described again. In the electrostatic protection circuit of FIG. 5, the gate of the P-channel transistor P1 is connected to the output (node B) of the pre-driver of the CMOS circuit comprising the N-channel transistor N2 and P-channel transistor P2. The source of the P-channel transistor P1 is connected to the power source terminal VDD. The drain of the N-channel transistor N1 and the drain of the P-channel transistor P1 are tied together and connected to the output terminal Out. The source and gate of the N-channel transistor N1 are connected to the ground terminal GND and to an internal circuit (not shown), respectively. The N-channel transistor N1 and the P-channel transistor P1 construct a final-stage output driver. Furthermore, an electrostatic protection element 20a has a structure similar to that of the electrostatic protection element 20 in FIG. 1.

In the electrostatic protection circuit constructed as set forth above, the electrostatic protection elements 10a, 10b function as a first protection element (main protection element), and the electrostatic protection element 20a functions as a second protection element. The pre-driver and the final-stage output driver correspond to elements to be protected by the electrostatic protection elements 10a, 10b, 20a. That is, in a case where voltage $V_{ESD}$ ascribable to electrostatic discharge is impressed upon the output terminal Out, discharge current Id that cannot be absorbed by the electrostatic protection element 10b flows from the power source terminal VDD into the output terminal Out via the electrostatic protection element 20a and resistance Rp between the drain and source of the P-channel transistor P2, which is ON. At this time, discharge current Id flows into the resistance Rp, as a result of which the potential at the output (node B) in the pre-driver falls. Here the resistance Rp corresponds to the sum total of the channel resistance between the drain and source of the P-channel transistor P2, diffusion-layer resistance of the drain and source of this transistor, and resistance of an extension region underlying the side walls of the drain and source of this transistor. Owing to the resistance Rp, the gate voltage of the P-channel transistor P1 falls and the voltage $V_{ESD}$ is directly impressed across the drain and gate of the P-channel transistor P1. As a result, damage to the P-channel transistor P1 due to electrostatic discharge is prevented. If the P-channel transistor P2 is OFF, the potential at the output (node B) of the pre-driver becomes a potential that is intermediate the potential of the power source terminal VDD and the potential at the ground terminal GND, and the voltage $V_{ESD}$ is not directly impressed across the drain and gate of the N-channel transistor N1.

Further, since the electrostatic protection elements 10a, 10b, 20a exhibit a high impedance to an output signal of an ordinary level, they have no adverse effect upon the output of the output signal from the output terminal Out.

Fourth Exemplary Embodiment

Figure 6:
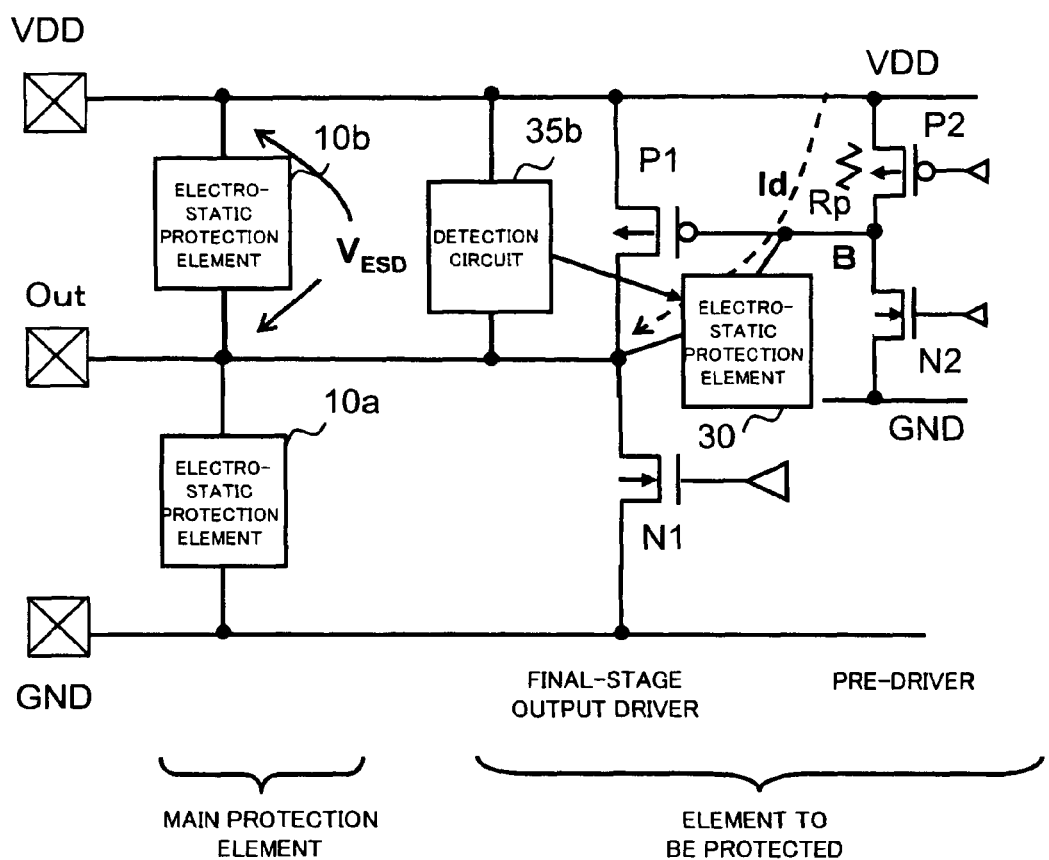
FIG. 6 is a block diagram illustrating the configuration of an electrostatic protection circuit according to a fourth exemplary embodiment of the present invention.

FIG. 6 is a block diagram illustrating the configuration of an electrostatic protection circuit according to a fourth exemplary embodiment of the present invention. Components in FIG. 6 identical with those shown in FIG. 3 are designated by like reference characters and need not be described again. The electrostatic protection circuit of FIG. 6 is a complementary circuit in which the power source terminal VDD and ground terminal GND are interchanged, the N-channel transistor N1 and P-channel transistor P1 are interchanged, the N-channel transistor N2 and P-channel transistor P2 are interchanged and the position at which the detection circuit 35a is interchanged to construct a detection circuit 35b. Accordingly, the electrostatic protection circuit of FIG. 6 operates in a manner complementary to that described in the second exemplary embodiment and damage to the P-channel transistor P1 due to electrostatic discharge is prevented.

Fifth Exemplary Embodiment

Figure 7:
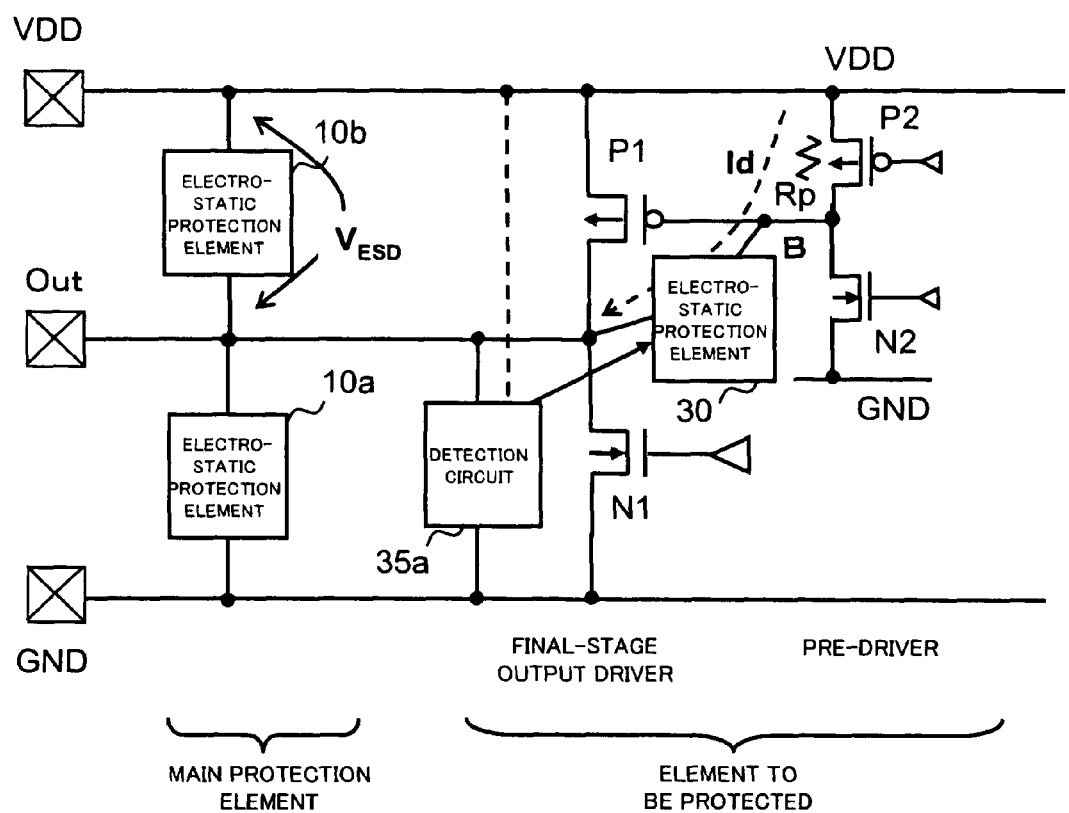
FIG. 7 is a block diagram illustrating the configuration of an electrostatic protection circuit according to a fifth exemplary embodiment of the present invention.

FIG. 7 is a block diagram illustrating the configuration of an electrostatic protection circuit according to a fifth exemplary embodiment of the present invention. Components in FIG. 7 identical with those shown in FIG. 6 are designated by like reference characters and need not be described again. In the electrostatic protection circuit of FIG. 7, the detection circuit 35a shown in FIG. 3 is inserted instead of the detection circuit 35b of FIG. 6 at a position similar to that shown in FIG. 3. The detection circuit 35a detects the signal level at the output terminal Out and controls the electrostatic protection element 30 in such a manner that the electrostatic protection element 30 exhibits a low impedance if static electricity having a voltage equal to or greater than a prescribed voltage is applied to the output terminal Out. Accordingly, the electrostatic protection circuit of FIG. 7 operates in a manner complementary to that described in the second exemplary embodiment and damage to the P-channel transistor P1 due to electrostatic discharge is prevented.

Sixth Exemplary Embodiment

Figure 8:
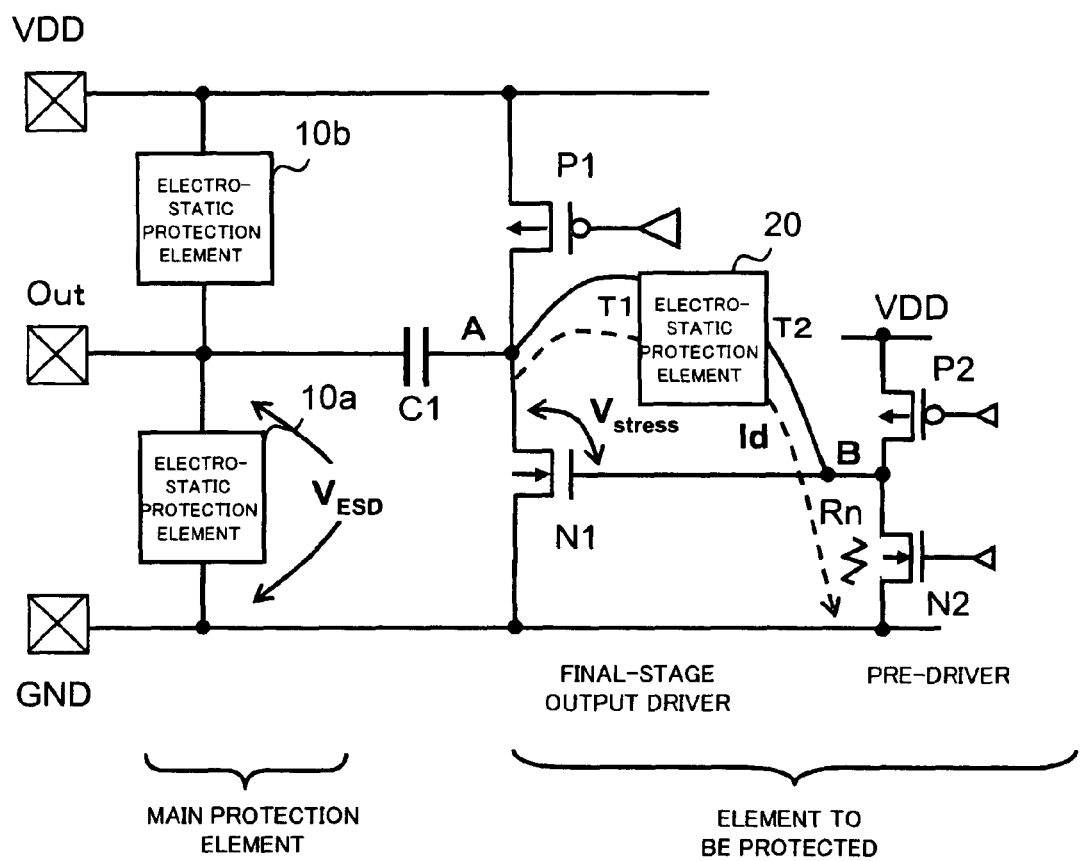
FIG. 8 is a block diagram illustrating the configuration of an electrostatic protection circuit according to a sixth exemplary embodiment of the present invention.

FIG. 8 is a block diagram illustrating the configuration of an electrostatic protection circuit according to a sixth exemplary embodiment of the present invention. Components in FIG. 8 identical with those shown in FIG. 1 are designated by like reference characters and need not be described again. In the electrostatic protection circuit of FIG. 8, capacitance element C1 is provided between the output terminal Out and a point A at which the drains of the N-channel transistor N1 and P-channel transistor P1 and one end (T1) of the electrostatic protection element 20 are connected. The capacitance element C1 can be regarded as a low impedance to application of voltage $V_{ESD}$, which is ascribable to electrostatic discharge, to the output terminal Out, and to an AC signal in the output signal. Accordingly, the electrostatic protection circuit of FIG. 8 operates in a manner similar to that described in the first exemplary embodiment, and damage to the N-channel transistor N1 due to electrostatic discharge is prevented.

Seventh Exemplary Embodiment

Figure 9:
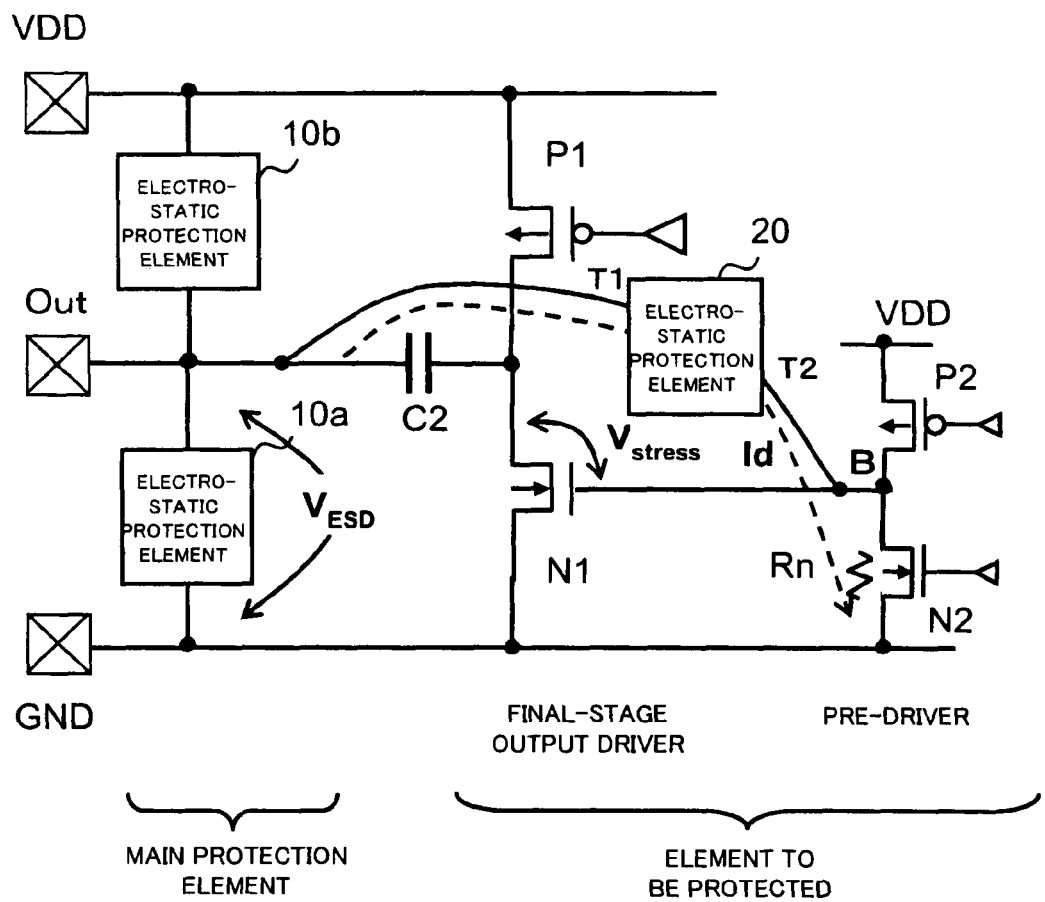
FIG. 9 is a block diagram illustrating the configuration of an electrostatic protection circuit according to a seventh exemplary embodiment of the present invention.

FIG. 9 is a block diagram illustrating the configuration of an electrostatic protection circuit according to a seventh exemplary embodiment of the present invention. Components in FIG. 9 identical with those shown in FIG. 1 are designated by like reference characters and need not be described again. In the electrostatic protection circuit of FIG. 9, a capacitance element C2 is provided between a point at which the drains of the N-channel transistor N1 and P-channel transistor P1 are connected and a point at which one end (T1) of the electrostatic protection element 20 and the output terminal Out are connected. The electrostatic protection element 20 connects the drain and gate of the N-channel transistor N1 via the capacitance element C2. The capacitance element C2 can be regarded as a low impedance to application of voltage $V_{ESD}$, which is ascribable to electrostatic discharge, to the output terminal Out, and to an AC signal in the output signal. Accordingly, the electrostatic protection circuit of FIG. 9 operates in a manner similar to that described in the first exemplary embodiment, and damage to the N-channel transistor N1 due to electrostatic discharge is prevented.

Eighth Exemplary Embodiment

Figure 10:
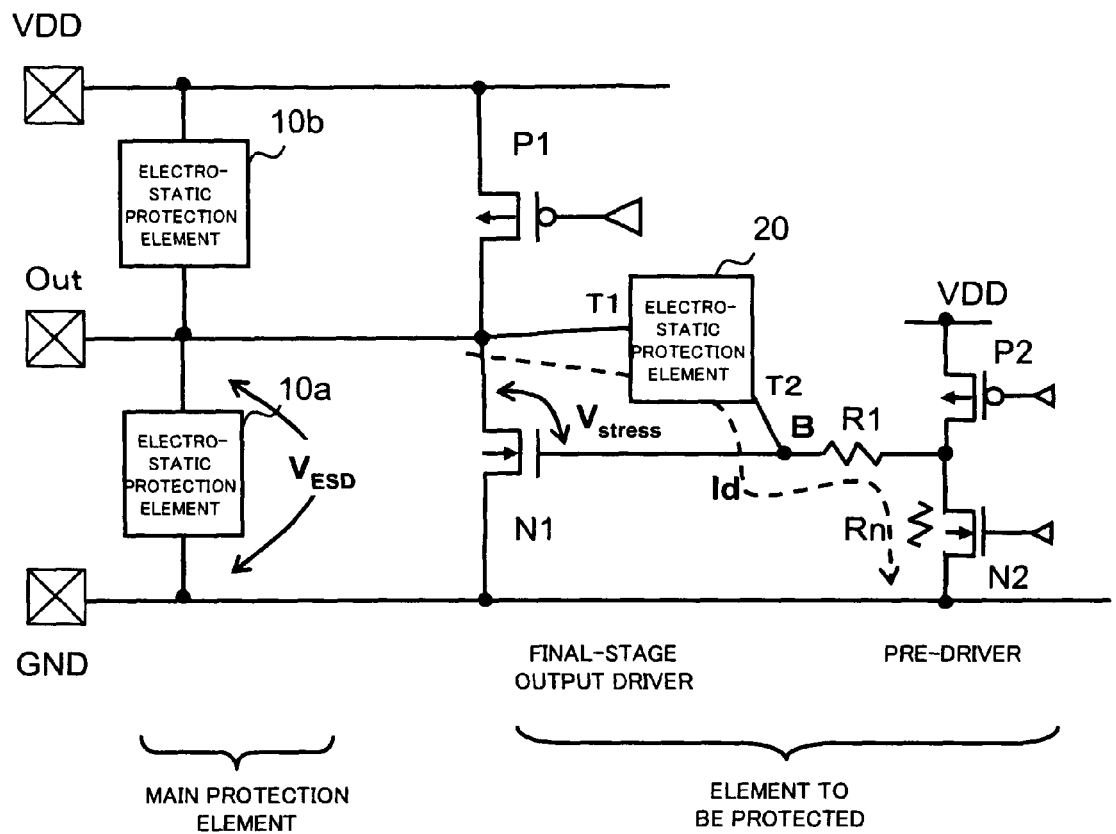
FIG. 10 is a block diagram illustrating the configuration of an electrostatic protection circuit according to an eighth exemplary embodiment of the present invention.

FIG. 10 is a block diagram illustrating the configuration of an electrostatic protection circuit according to an eighth exemplary embodiment of the present invention. Components in FIG. 10 identical with those shown in FIG. 1 are designated by like reference characters and need not be described again. In the electrostatic protection circuit of FIG. 10, a resistance element R1 is provided between a point at which the second end T2 of the electrostatic protection element 20 and the gate of N-channel transistor N1 are connected and a point at which the drains of the N-channel transistor N2 and P-channel transistor P2 are connected. If its resistance value is small, the resistance element R1 is not likely to influence the transfer of an ordinary output signal in the output circuit. Accordingly, damage to the N-channel transistor N1 by electrostatic discharge is prevented through an operation similar to that described in the first exemplary embodiment. In this case, the voltage $V_{ESD}$ due to electrostatic discharge is impressed upon the output terminal Out, as a result of which the discharge current Id flows through the resistance element R1. Accordingly, the gate potential of the N-channel transistor N1 rises further and the potential across the drain and gate of the N-channel transistor N1 declines. The resistance element R1 therefore affords more desirable effects in terms of ability to withstand static electricity.

Ninth Exemplary Embodiment

FIG. 11 is a block diagram illustrating the configuration of an electrostatic protection circuit according to a ninth exemplary embodiment of the present invention. Components in FIG. 11 identical with those shown in FIG. 1 are designated by like reference characters and need not be described again. In the electrostatic protection circuit of FIG. 11, the final-stage output driver constructs a differential amplifier circuit. Specifically, a differential pair is constructed by the N-channel transistor N1 and an N-channel transistor N11, and the sources of the N-channel transistor N1 and N-channel transistor N11 are tied together and connected to the drain of an N-channel transistor N3 serving as a current source. The N-channel transistor N3 has its source connected to the ground terminal GND and its gate connected to the internal circuit, not shown. Further, the N-channel transistor N1 has its drain connected to the power source terminal VDD via a resistance element R2. Further, the N-channel transistor N1 has its drain connected to the power source terminal VDD via the resistance element R2. The gate and drain of the N-channel transistor N11 are connected to the internal circuit, not shown.

The electrostatic protection circuit constructed as set forth above is such that in a case where the voltage $V_{ESD}$ due to electrostatic discharge is impressed upon the output terminal Out, damage to the N-channel transistor N1 by electrostatic discharge is prevented through an operation similar to that described in the first exemplary embodiment.

Tenth Exemplary Embodiment

Figure 12:
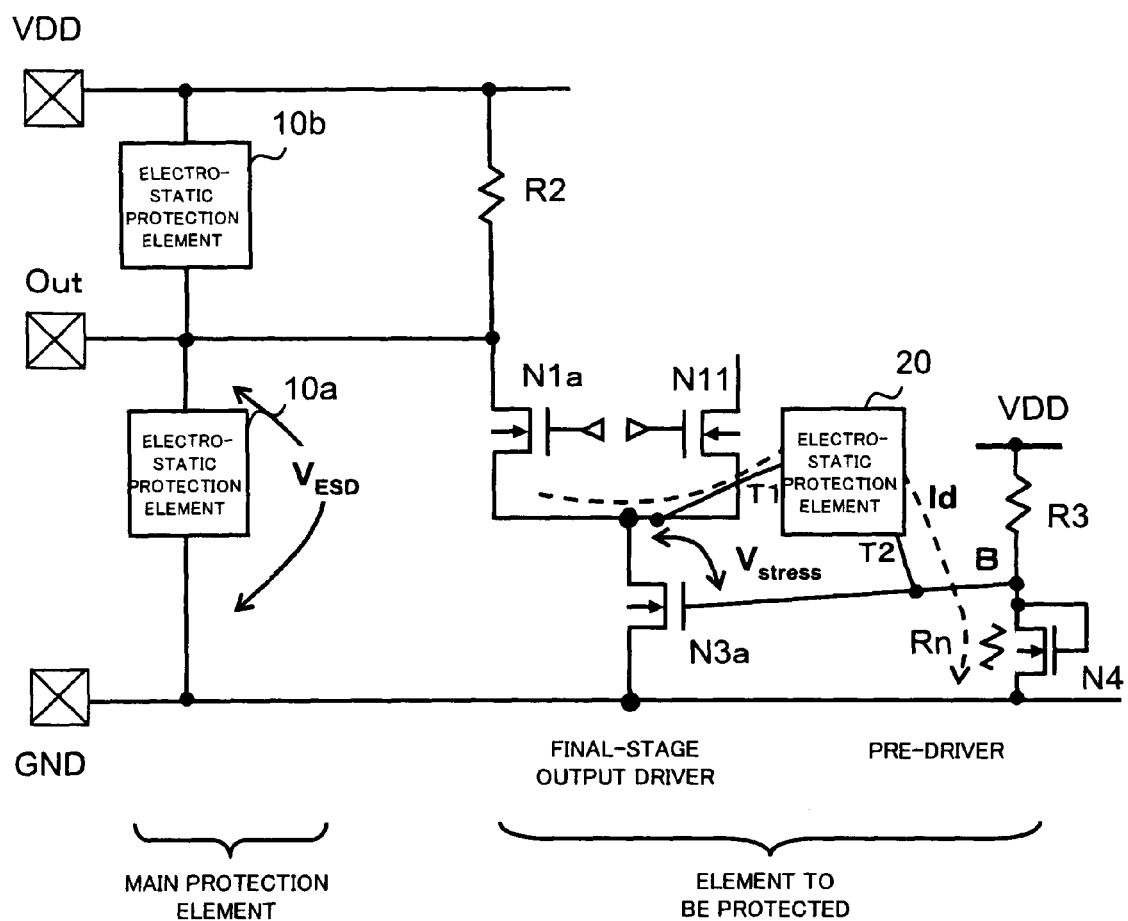
FIG. 12 is a block diagram illustrating the configuration of an electrostatic protection circuit according to a tenth exemplary embodiment of the present invention.
Figure 13:
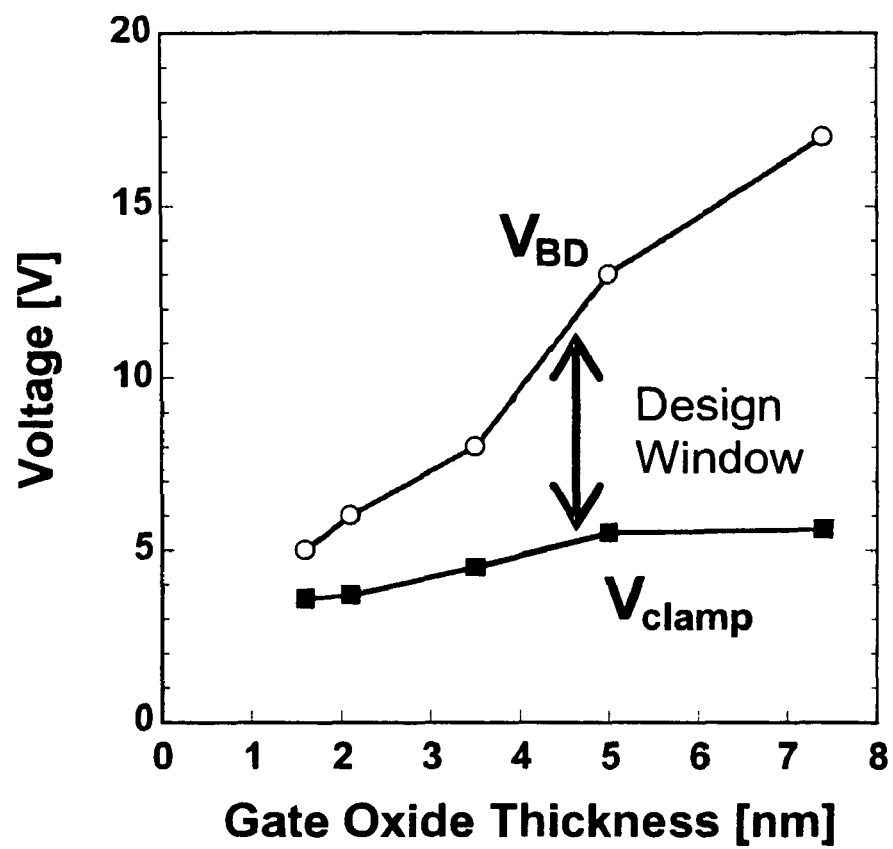
FIG. 13 is a diagram, underlying and provided in the present invention for illustrating change in breakdown voltage ($V_{BD}$) of a gate oxide film and in clamp voltage ($V_{clamp}$) of a protection element accompanying finer patterning of a transistor.
Figure 14:
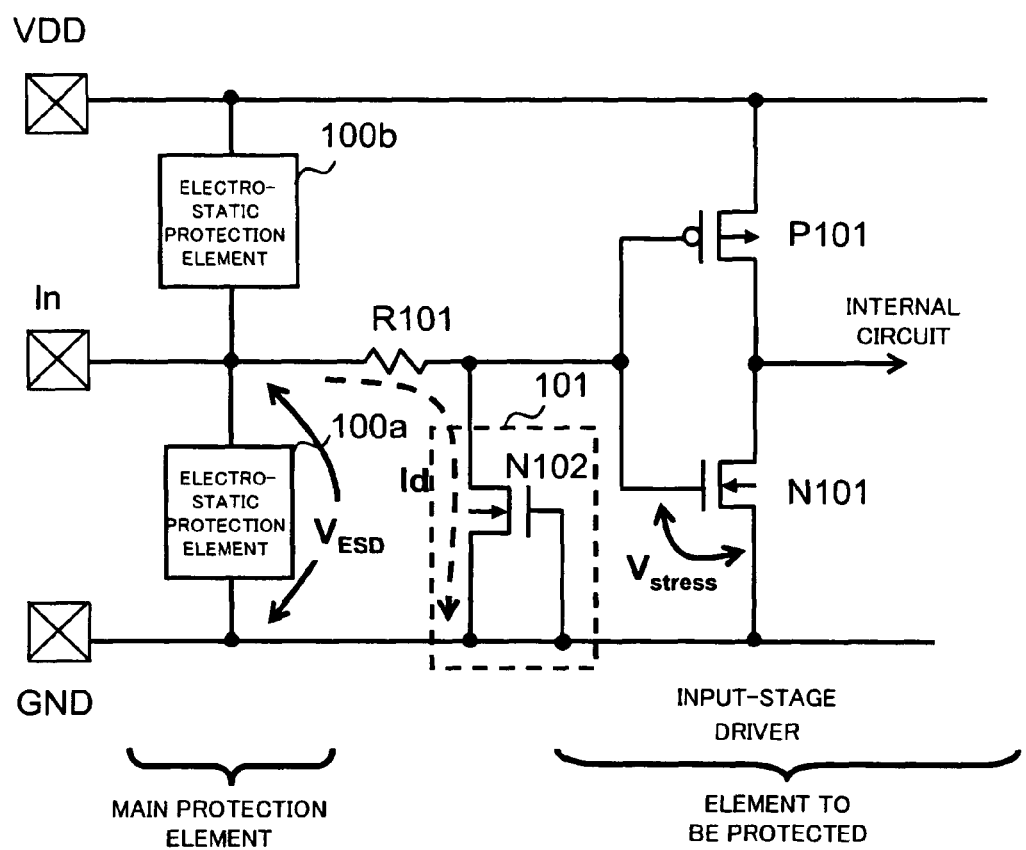
FIG. 14 is a circuit diagram illustrating a first comparative example of an electrostatic protection circuit according to the teaching of a related art illustrated by the present invention for comparison.
Figure 15:
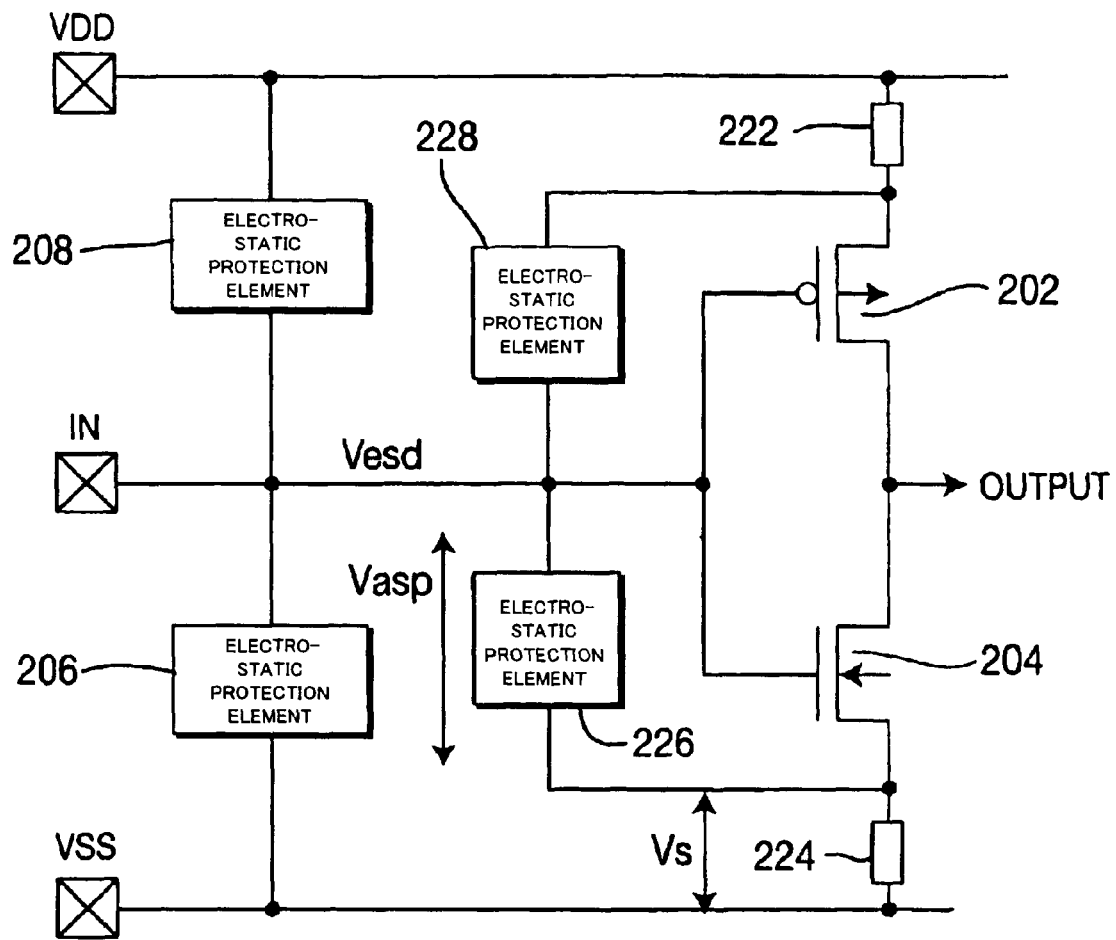
FIG. 15 is a circuit diagram illustrating a second example of an electrostatic protection circuit according to the teaching of a related art.

FIG. 12 is a block diagram illustrating the configuration of an electrostatic protection circuit according to a tenth exemplary embodiment of the present invention. Components in FIG. 12 identical with those shown in FIG. 11 are designated by like reference characters and need not be described again. In the electrostatic protection circuit of FIG. 12, the final-stage output driver constructs a differential amplifier circuit. Specifically, a differential pair is constructed by an N-channel transistor N1a and the N-channel transistor N11, and the sources of the N-channel transistor N1a and N-channel transistor N11 are tied together and connected to the drain of an N-channel transistor N3a serving as a current source. The N-channel transistor N3a has its source connected to the ground terminal GND. Further, the gate of the N-channel transistor N3a is connected to the point of connection between a resistance element R3 and a diode-connected N-channel transistor N4, which are serially connected between the power source terminal VDD and ground terminal GND. The N-channel transistor N3a has its drain and source connected between the output terminal Out and the ground terminal GND via the N-channel transistor N1a. The N-channel transistor N3a functions as a current source for the differential pair comprising the N-channel transistor N1a and N-channel transistor N11. The electrostatic protection element 20 is connected between the drain and gate of the N-channel transistor N3a.

In the electrostatic protection circuit constructed as described above, assume that the N-channel transistor N1a is in the ON state. If the voltage $V_{ESD}$ ascribable to electrostatic discharge is impressed upon the output terminal Out under these conditions, damage to the N-channel transistor N3a by electrostatic discharge is prevented through an operation similar to that for electrostatic protection of the N-channel transistor N1 described in the first exemplary embodiment.

The specific modified components or circuit connection thereof of any of the aforementioned exemplary embodiments or examples may be exchangeable, insertable and for combinable with any of the aforementioned exemplary embodiments.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An electrostatic protection circuit comprising:
a first terminal for outputting a signal;
a second terminal for receiving power or a ground potential;
a first MOS (metal-oxide semiconductor) transistor including a drain and a source coupled to said first and second terminals, respectively;
a first electrostatic protection element connecting said first and second terminals; and
a second electrostatic protection element connecting a gate of said first MOS transistor and either of said first terminal and the drain of said first MOS transistor,
wherein said first terminal comprises an output terminal, said second terminal comprises a power source terminal or ground terminal, and said electrostatic protection circuit further comprises an output driver circuit having said output terminal as its output,
said first MOS transistor being included in said output driver circuit,
wherein said output driver circuit includes a differential amplifier circuit for output purposes, and
wherein said first MOS transistor comprises one transistor of a differential pair in said differential amplifier circuit.

2. An electrostatic protection circuit comprising:
a first terminal for outputting a signal;
a second terminal for receiving power or a ground potential;
a first MOS (metal-oxide semiconductor) transistor including a drain and a source coupled to said first and second terminals, respectively;
a first electrostatic protection element connecting said first and second terminals; and
a second electrostatic protection element connecting a gate of said first MOS transistor and either of said first terminal and the drain of said first MOS transistor,
wherein said first terminal comprises an output terminal said second terminal comprises a power source terminal or ground terminal, and said electrostatic protection circuit further comprises an output driver circuit having said output terminal as its output,
said first MOS transistor being included in said output driver circuit,
wherein said output driver circuit includes a differential amplifier circuit for output purposes, and
wherein said first MOS transistor comprises a current-source transistor connected to sources of a transistor pair in said differential amplifier circuit.

3. An electrostatic protection circuit comprising:
a first terminal;
a second terminal;
a first MOS (metal-oxide semiconductor) transistor of a differential pair of transistors for output of a signal through the first terminal, the first MOS transistor including a drain and a source connected between said first and second terminals;
a first electrostatic protection element connecting said first and second terminals; and
a second electrostatic protection element connecting a gate of said first MOS transistor to one of said first and second terminals,
said one of said first and second terminals being connected to the drain of said first MOS transistor.

4. The electrostatic protection circuit according to claim 3, wherein an internal circuit is connected to the gate of said first MOS transistor; and
gate-to-drain voltage of said first MOS transistor is limited to a value below a prescribed value by a current that flows into said second electrostatic protection element owing to application of static electricity to the first terminal, and a resistance of the internal circuit as seen from the gate of said first MOS transistor.

5. The electrostatic protection circuit according to claim 4, wherein the internal circuit includes a second MOS transistor of the same conductivity type as that of said first MOS transistor, said second MOS transistor having a drain connected to the gate of said first MOS transistor and a source connected to a ground terminal; and
the resistance of the internal circuit includes a drain-to-source resistance component of said second MOS transistor.

6. The electrostatic protection circuit according to claim 3, wherein said first terminal comprises an output terminal, said second terminal comprises a power source terminal or ground terminal, and said electrostatic protection circuit further comprises an output driver circuit having said output terminal as its output;
said first MOS transistor being included in said output driver circuit.

7. The electrostatic protection circuit according to claim 6, wherein said output driver circuit includes a differential amplifier circuit for output purposes; and
said first MOS transistor comprises one transistor of a differential pair in said differential amplifier circuit.

8. The electrostatic protection circuit according to claim 6, wherein said output driver circuit includes a differential amplifier circuit for output purposes; and said first MOS transistor comprises a current-source transistor connected to sources of a transistor pair in said differential amplifier circuit.

9. The electrostatic protection circuit according to claim 3, wherein said one of the first and second terminals is indirectly connected to the drain of said first MOS transistor via an impedance or coupler element.

10. The electrostatic protection circuit according to claim 9, wherein said impedance or coupler element comprises a capacitor.

11. The electrostatic protection circuit according to claim 3, wherein said one of the first and second terminals is indirectly connected to the drain of said first MOS transistor via a transistor constituting a differential pair.

12. The electrostatic protection circuit according to claim 3, wherein said first MOS transistor constitutes one of a differential pair transistors.

13. A semiconductor device having the electrostatic protection circuit set forth in claim 3.

14. An electrostatic protection circuit comprising:
a first terminal for outputting a signal;
a second terminal for receiving power or a ground potential;
a first MOS (metal-oxide semiconductor) transistor including a drain and a source coupled to said first and second terminals, respectively;
a first electrostatic protection element connecting said first and second terminals;
a second electrostatic protection element connecting a gate of said first MOS transistor and either of said first terminal and the drain of said first MOS transistor; and a differential pair of transistors for output to the first terminal, the differential pair of transistors comprising the first MOS transistor.

15. An electrostatic protection circuit comprising:
a first terminal for outputting a signal;
a second terminal for receiving power or a ground potential;
a first MOS (metal-oxide semiconductor) transistor including a drain and a source coupled to said first and second terminals respectively;
a first electrostatic protection element connecting said first and second terminals;
a second electrostatic protection element connecting a gate of said first MOS transistor and either of said first terminal and the drain of said first MOS transistor; and
an output driver circuit including a differential amplifier circuit for output to the first terminal as the output terminal,
wherein a one of first and second terminals is connected to the drain of the first MOS transistor through impedance or a coupler element.

* * * * *